(12) United States Patent
Engl et al.

(10) Patent No.: US 7,675,146 B2
(45) Date of Patent: Mar. 9, 2010

(54) SEMICONDUCTOR DEVICE WITH LEADFRAME INCLUDING A DIFFUSION BARRIER

(75) Inventors: Reimund Engl, Regensberg (DE); Michael Bauer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 229 days.

(21) Appl. No.: 11/851,977

(22) Filed: Sep. 7, 2007

(65) Prior Publication Data
US 2009/0065914 A1    Mar. 12, 2009

(51) Int. Cl.
H01L 23/495    (2006.01)
(52) U.S. Cl. .............................. 257/676; 257/E23.037

(58) Field of Classification Search ................ 257/676, 257/724, 751, 787, E23.037
See application file for complete search history.

(56) References Cited

U.S. PATENT DOCUMENTS

| 5,122,860 A * | 6/1992 | Kikuchi et al. ............. 257/679 |
| 6,194,777 B1 * | 2/2001 | Abbott et al. .............. 257/666 |
| 2007/0025684 A1 | 2/2007 | Otremba |

* cited by examiner

*Primary Examiner*—Mark Prenty
(74) *Attorney, Agent, or Firm*—Dicke, Billig & Czaja, PLLC

(57) ABSTRACT

A semiconductor device includes a leadframe having a first face and an opposing second face, a portion of the first face defining a die pad, a diffusion barrier deposited on at least a portion of the die pad, and at least one chip coupled to the diffusion barrier.

21 Claims, 6 Drawing Sheets

SEMICONDUCTOR DEVICE WITH LEADFRAME INCLUDING A DIFFUSION BARRIER

BACKGROUND

Market demand for smaller and more powerful electronic devices has driven the development of compact packages having increased functionality. One particularly economical and useful semiconductor package includes a supporting leadframe, a chip electrically coupled to the leadframe, and encapsulating material molded over a first surface of the leadframe and the chip. The encapsulating material thus defines an upper exterior surface of the package, while a second non-encapsulated surface of the leadframe defines a lower exterior surface of the package that is configured to be coupled to a printed circuit board. Conventionally, these forms of semiconductor packages provide multiple input and output connection areas, and are attachable to a wide range of semiconductor boards.

The leadframe provides a support structure for the package. Some semiconductor packages include chip-by-chip packages that have a first chip coupled to but electrically isolated from a metal leadframe, and a second chip coupled to and in electrical communication with the leadframe. It is desired to maintain a potential voltage difference between the first chip and the second chip in these chip-by-chip packages. However, over time, metal ions from the metal leadframe will diffuse through the isolating adhesion layer coupling the first electrically isolated chip to the leadframe. Eventually, the undesirable diffusion of the metal ions to a backside of the first electrically isolated chip will negatively affect performance of the chip and performance of the semiconductor package.

For these and other reasons there is a need for the present invention.

SUMMARY

One aspect provides a semiconductor device including a leadframe having a first face and an opposing second face, a portion of the first face defining a die pad, a diffusion barrier deposited on at least a portion of the die pad, and at least one chip coupled to the diffusion barrier.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments described below provide a semiconductor device such as a semiconductor package or a semiconductor assembly including a leadframe having a diffusion barrier deposited on at least a portion of a die pad of the leadframe. The diffusion barrier is deposited onto a surface of the leadframe and provides an effective barrier against the migration/diffusion of metal ions from the metal leadframe to a chip coupled to the leadframe/diffusion barrier.

In one embodiment, a diffusion barrier is deposited onto a copper leadframe and provides improved adhesion between the copper leadframe and components coupled to the copper leadframe as compared to components coupled directly to the copper surface of the leadframe. The diffusion barrier contacts the leadframe. In contrast to known semiconductor devices that include a diffusion barrier applied to the chip, the diffusion barrier described below minimizes or eliminates migration of metal ions from the leadframe at the surface of the leadframe before the ions move to and undesirably affects the chip.

In one embodiment, a diffusion barrier is deposited onto a metal leadframe, preventing delamination of the leadframe and preventing the metal from being exposed to oxygen, thereby minimizing undesirable oxidation of the metal. To this end, the diffusion barrier provides improved electrical properties by minimizing oxidation of copper portions of the leadframe, and further contributes to improved adhesion of components to the leadframe. In general, the diffusion barrier is deposited as a thin film or thin layer and does not necessitate design alterations or design changes to the leadframe, chips or semiconductor die, or other components or materials coupled to the leadframe.

Figure 1:
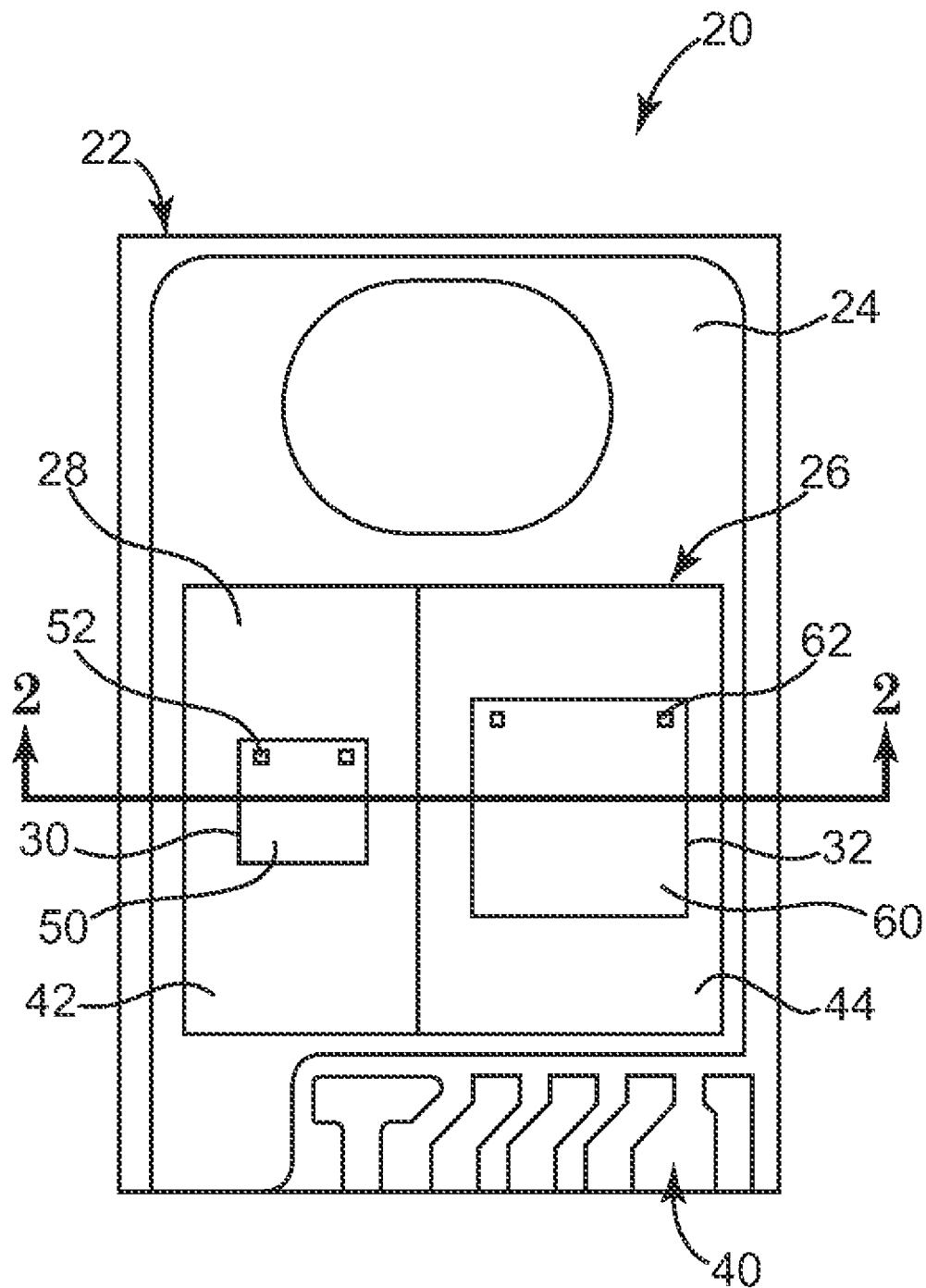
FIG. 1 is a top view of a leadframe including a diffusion barrier deposited on a portion of a die pad of the leadframe according to one embodiment.
Figure 2:
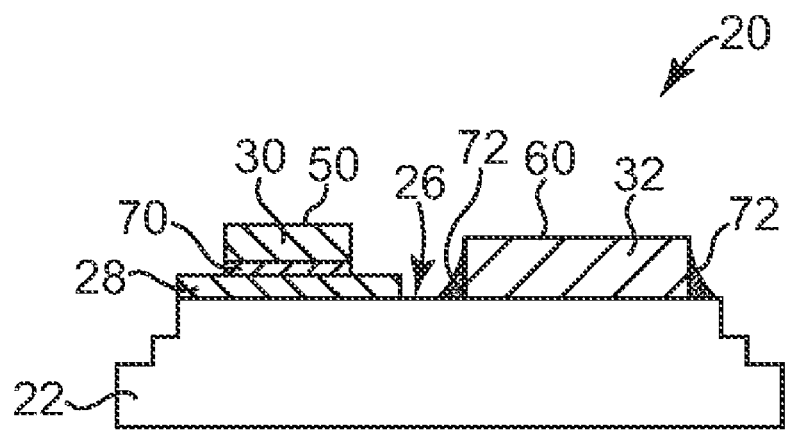
FIG. 2 is a cross-sectional view of the leadframe of FIG. 1 illustrating a chip coupled to the diffusion barrier according to one embodiment.

FIG. 1 and FIG. 2 illustrate a semiconductor device 20 according to one embodiment. FIG. 1 is a top view of semiconductor device 20, and FIG. 2 is a cross-sectional view of semiconductor device 20 taken along line 2-2 of FIG. 1. With reference to FIGS. 1 and 2, semiconductor device 20 includes a leadframe 22 having a first face 24 that defines a die pad 26 (or die paddle 26), a diffusion barrier 28 deposited on at least a portion of die pad 26, a first chip 30 coupled to diffusion barrier 28, and a second chip 32 coupled to die pad 26. In one embodiment, leadframe 22 supports a chip-by-chip semiconductor device (e.g., chip 30 and chip 32 provide an exemplary embodiment of a chip-by-chip assembly) where the chips 30, 32 are maintained on leadframe 22 at different voltage potentials. Other forms of semiconductor devices are also acceptable.

Leadframe 22 includes leadless package frames, thin small leadless package (TSLP) frames, and other suitable package interposers. In one embodiment, leadframe 22 is a package interposer disposed between an integrated circuit such as first chip 30 and a circuit board (See FIG. 9). In general, leadframe 22 provides a carrier for semiconductor device 20, and suitable carriers include quad flat, dual flat, dual small outline, and thin shrink small outline package carriers. In one embodiment, leadframe 22 is a copper leadframe suitably configured to support components of semiconductor device 20 and includes leads 40 along at least a portion of perimeter of leadframe 22. In one embodiment, leadframe 22 is a metal leadframe and die pad 26 includes a silver surface or a surface having a gold flash coating. Leads 40 are etched or stamped on leadframe 22 and disposed on at least one side of leadframe.

Leadframe 22 is illustrated in a generalized form for descriptive clarity. However, in one embodiment leadframe 22 includes a quad flat no-lead (QFN) leadframe having leads 40 provided on all four sides of leadframe 22. In one embodiment, leadframe 22 includes a dual flat no-lead (DFN) leadframe having leads 40 provided on two opposing sides of leadframe 22. Leads 40 provide input/output terminals suited for electrical connection to chip 24, and between about 4 to 156 leads are typically provided depending upon whether leadframe 26 is a QFN of DFN leadframe. Other forms of leadframe 22 and other configurations for leads 40 are also acceptable.

In one embodiment, die pad 26 includes a first portion 42 and a second portion 44, and diffusion barrier 28 is deposited on first portion 42 of die pad 26. In one embodiment, first portion 42 includes about one-half of the surface area of die pad 26. In another embodiment, first portion 42 includes substantially all of the area of die pad 26 such that diffusion barrier 28 occupies substantially an entirety of die pad 26.

In one embodiment, first chip 30 includes an active surface 50 and at least one contact 52 formed on active surface 50. In one embodiment, second chip 32 includes active surface 60 and has at least one contact 62 formed on active surface 60.

FIG. 2 is a cross-sectional view of leadframe 20. Contacts 52, 62 are part of their respective active surfaces 50, 60 and are not visible in the cross-sectional view of FIG. 2. In one embodiment, first chip 30 is coupled to diffusion barrier 28 by an electrically isolating adhesion material 70, and second chip 32 is electrically coupled to die pad 26 by solder 72. In one embodiment, adhesion material is a double-sided electrically isolating adhesive tape. In another embodiment, adhesion material 70 is an electrically isolating adhesive paste. Other forms of adhesion material 70 are also acceptable. In one embodiment, solder 72 is deposited on sides of second chip 32 to form solder fillets, as shown. Other suitable forms of electrically coupling second chip 32 to die pad 26 are also acceptable.

In one embodiment, first chip 30 is a control chip that is electrically isolated from die pad 26 and second chip 32. In one embodiment, second chip 32 is a vertical high voltage and power transistor chip including a source/gate on a front side and drain on a backside. The backside is electrically connected to die pad 26 by a conductive material, such as solder 72, or a conductive epoxy, and/or a conductive metal paste including silver pastes and the like. In one embodiment, second chip 32 is a metal oxide semiconductor field effect transistor (MOSFET) power chip having the same electrical potential as die pad 26. In one embodiment, die pad 26 and second chip 32 are maintained at a voltage configuration having a voltage potential of between about 100-400 volts, preferably 200 volts relative to first isolated chip 30.

In one embodiment, leadframe 22 is a metal leadframe and diffusion barrier 28 is deposited on die pad 26 and is configured to minimize or eliminate diffusion of metal ions from leadframe 22 into first chip 30. Diffusion barrier 28 includes tantalum (Ta), tantalum nitride (TaN), titanium (Ti), titanium tungsten (TiW), or other suitable barriers to the diffusion of copper ions into and through adhesion material 70. In one embodiment, diffusion barrier 28 is deposited onto leadframe 22 at a thickness of between about 0.1 to 10 micrometers and in a manner that does not substantially change the thickness of leadframe 22. In one embodiment, diffusion barrier 28 is deposited and configured to not substantially expand the total geometry of semiconductor device 20, change the design of chips 30, 32, or affect the selection of die attach materials.

Diffusion barrier 28 is disposed onto leadframe 22 and disposed between leadframe 22 and adhesion material 70. In general, adhesion materials that couple components to leadframe 22 are thin, and thus can be pre-disposed to the migration of metal ions from leadframe 22 to the components, such as chip 30. Conventional chips having a diffusion barrier on one or more sides of the chip are ineffective at preventing the diffusion of metal ions from the metal leadframe into the adhesion material coupling the chip to the leadframe. In contrast, diffusion barrier 28 is disposed between leadframe 22 and adhesion material 70 and forms an effective barrier to the diffusion or migration of metal ions from metal leadframe 22 into the adhesion material 70 (and thus forms an effective barrier to the migration of metal ions to chip 30). Diffusion barrier 28 is configured to form a barrier to the diffusion or migration of metal ions from metal leadframe 22, such as copper ions from a copper leadframe or silver or gold ions from a silver surface or gold flashed surface of leadframe 22, into the adhesion material 70 and/or into chip 30.

Figure 3:
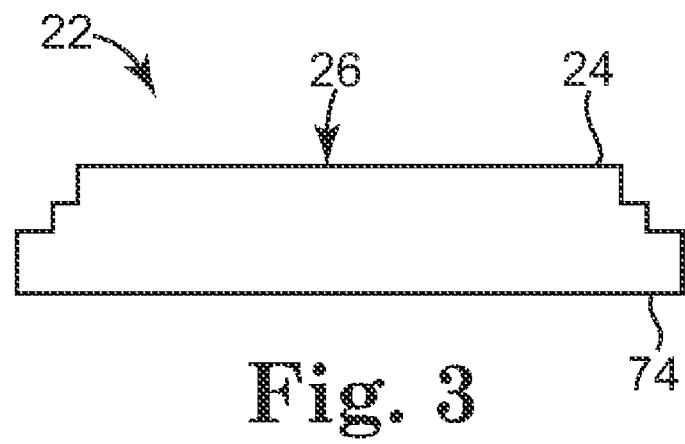
FIG. 3 is a side view of a leadframe according to one embodiment.

FIG. 3 is a side view of leadframe 22. Leadframe 22 includes first face 24 that defines die pad 26 and a second face 74 opposite first face 24. In one embodiment, second face 74 is configured for electrical coupling to another electronic device, such as a circuit board or a motherboard. Leadframe 22 is conductive and formed of metal such as copper, and is provided as a single leadframe 26, or in roll form including multiple leadframes, or in flat sheet form such that a plurality of leadframes 22 is processed in a series.

Figure 4:
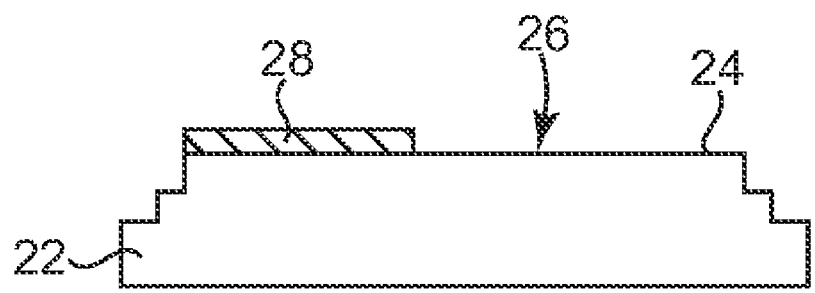
FIG. 4 is a side view of the leadframe of FIG. 3 including a diffusion barrier deposited on a portion of a die pad of the leadframe.

FIG. 4 is a side view of leadframe 22 including diffusion barrier 28 deposited onto a portion of die pad 26. In one embodiment, diffusion barrier 28 is selectively deposited on a portion of die pad 26 by a suitable deposition process such as sputter deposition, chemical vapor deposition, plasma activated vapor deposition, galvanic deposition, chemical deposition, or other suitable deposition process. In one embodiment, diffusion barrier 28 includes Ta, TaN, or TiW selectively deposited on a portion of die pad 26 (for example by masking) at a thickness of between about 0.1-10 micrometers, preferably at a thickness of between about 4-7 micrometers.

Figure 5:
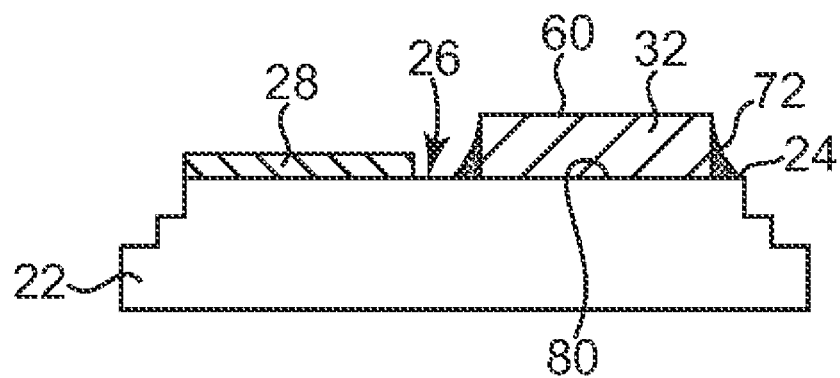
FIG. 5 is a side view of the leadframe of FIG. 4 including a chip electrically coupled to the die pad.

FIG. 5 is a side view of leadframe 22 including second chip 32 coupled to die pad 26 such that active surface 60 of chip 32 is oriented "up" relative to first face 24 of leadframe 22. In one embodiment, second chip 32 includes a second face 80 opposite active surface 60, and second face 80 is electrically coupled to die pad 26 of leadframe 22. In one embodiment, second chip 32 is electrically coupled to die pad 26 by a conductive solder 72. Other materials configured to electrically couple second face 80 of chip 32 to die pad 26 are also acceptable.

Figure 6:
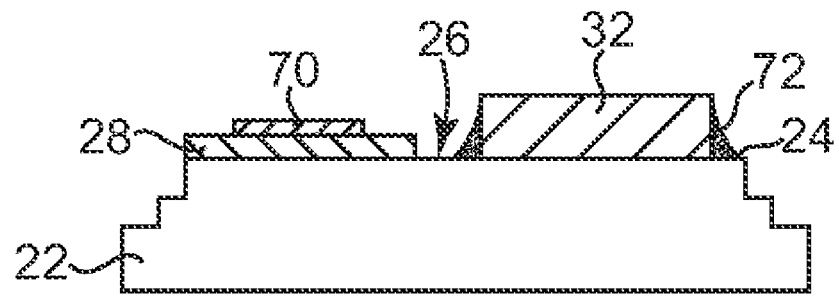
FIG. 6 is a side view of the leadframe of FIG. 5 including adhesion material deposited onto the diffusion barrier according to one embodiment.

FIG. 6 is a side view of leadframe 22 including diffusion barrier 28 deposited on die pad 26, and adhesion material 70 deposited on diffusion barrier 28. In one embodiment, adhesion material 70 includes an electrically insulating material that is selectively deposited on a portion of diffusion barrier 28. Suitable adhesion material 70 includes electrically isolating adhesive tapes, electrically isolating double-sided adhesive tapes, electrically isolating pastes, thermal conductive adhesives, or other suitable materials configured to couple first chip 30 (FIG. 1) to diffusion barrier 28 and electrically isolate chip 30 from die pad 26.

Figure 7:
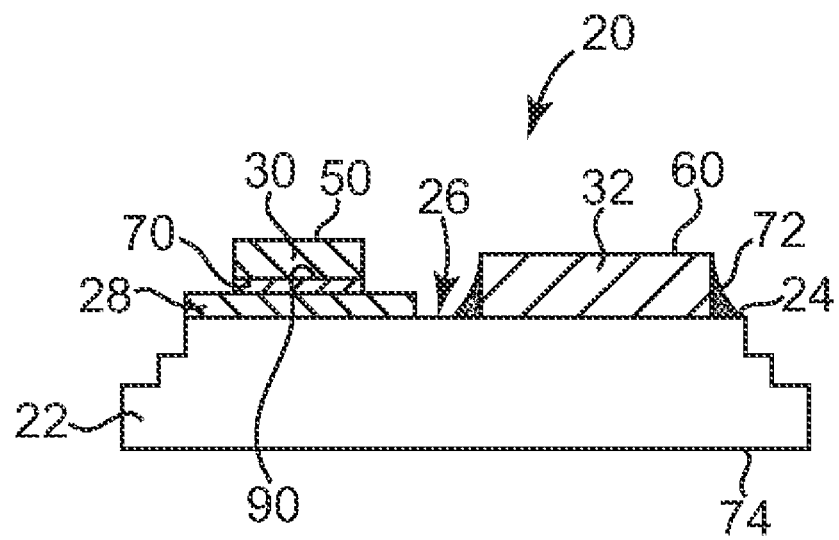
FIG. 7 is a side view of the leadframe shown in FIG. 6 including another chip coupled to the diffusion barrier by the adhesion material.

FIG. 7 is a side view of one embodiment of semiconductor device 20 including adhesion material 70 coupling first chip 30 to diffusion barrier 28 on leadframe 22. In one embodiment, first chip 30 includes active surface 50 and a second surface 90 opposite active surface 50, where second surface 90 is coupled to diffusion barrier 28 by adhesion material 70. Active surface 50 of first chip 30 and active surface 60 of second chip 32 are oriented "up" relative to first face 24 of leadframe 22, although other configurations are also acceptable. In one embodiment, second face 74 of semiconductor device 20 is configured to be coupled to another electronic device for use in semiconductor assemblies. In other embodiments, semiconductor device 20 is encapsulated by an insulating encapsulation material to form a semiconductor package for use in a variety of semiconductor systems.

Figure 8:
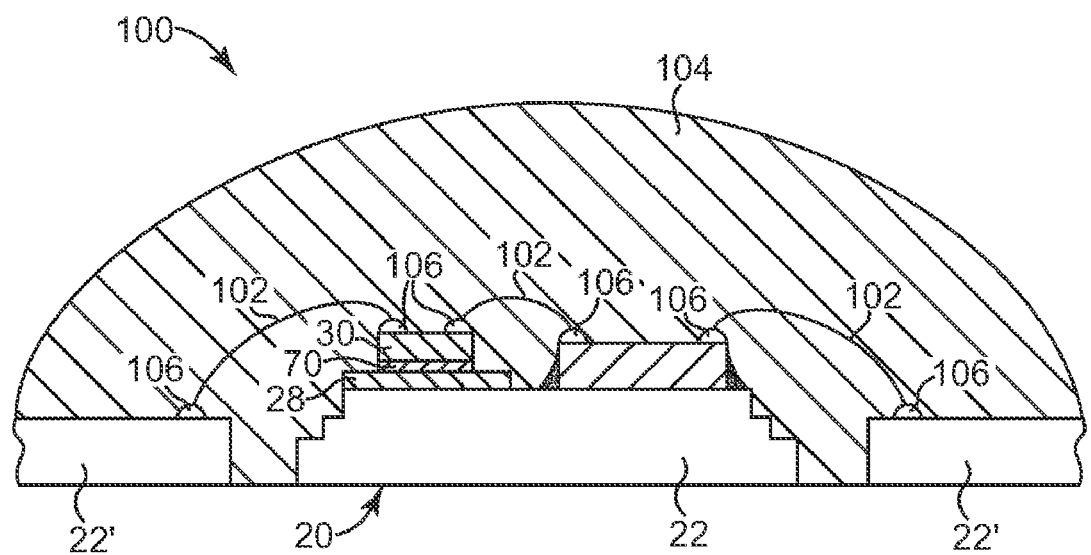
FIG. 8 is a cross-sectional view of a package including a leadframe having a diffusion barrier deposited on a portion of a die pad where a portion of the leadframe is encapsulated by a material according to one embodiment.

FIG. 8 is a cross-sectional view of a semiconductor assembly 100 according to one embodiment. In one embodiment, semiconductor assembly 100 is a semiconductor package 100 and includes semiconductor device 20, electrical connectors 102 electrically coupling components of semiconductor device 20, and an encapsulating material 104 deposited over semiconductor 20 and electrical connectors 102.

Semiconductor device 20 includes chip 30 coupled to diffusion barrier 28 by adhesion material 70, as described above. In one embodiment, leadframe 22 includes lateral portions 22' and electrical connectors 102 include wires 102 that are wire bonded between lateral portions 22' of leadframe 22 and chips 30, 32 and wires bonded between chips 30 and 32. In one embodiment, electrical connectors 102 extend between solder balls 106 deposited on leadframe portion 22' and chips 30 32. Other electrical connectors such as clips and other forms of bonding electrical connectors 102 on device 20 such as microbumps, stud bumps, ball-wedge bonding, tape automated bonding, controlled collapse chip connection, and solderless bonding are also acceptable.

In one embodiment, encapsulating material 104 includes epoxy, resin, moldable polymer or other suitable electrically insulating material configured to be deposited over leadframe 22 and connectors 102 to form a package protected/isolated from its local environment. In this manner, semiconductor assembly/package 100 provides a semiconductor device 20 that is protectively encapsulated by encapsulating material 104 and suited for electrical connection to printed circuit boards and the like.

Figure 9:
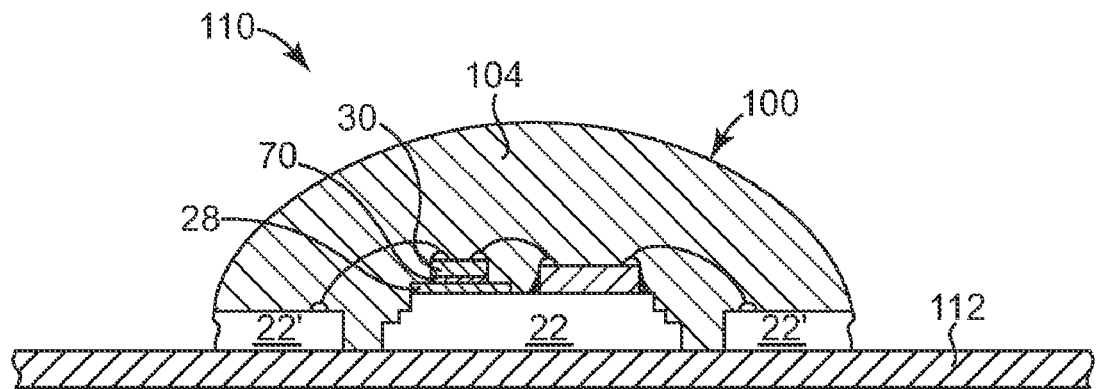
FIG. 9 is a cross-sectional view of a semiconductor assembly including the semiconductor package shown in FIG. 8 coupled to a printed circuit board according to one embodiment.

FIG. 9 is a cross-sectional view of another semiconductor assembly 110 according to one embodiment. Semiconductor assembly 110 includes semiconductor package 100 described above electrically coupled to a printed circuit board 112 or a mother board 112 by a suitable electrical connection such as solder, conductive adhesive, or other conductive electrical connects. Printed circuit board 112 includes any mechanical support configured to electrically connect electronic components employing conductive pathways, including high-density printed circuit boards, printed wiring boards, and etched wiring boards. In one embodiment, printed circuit board 112 is populated with other electronic components and defines a printed circuit board assembly.

Figure 10:
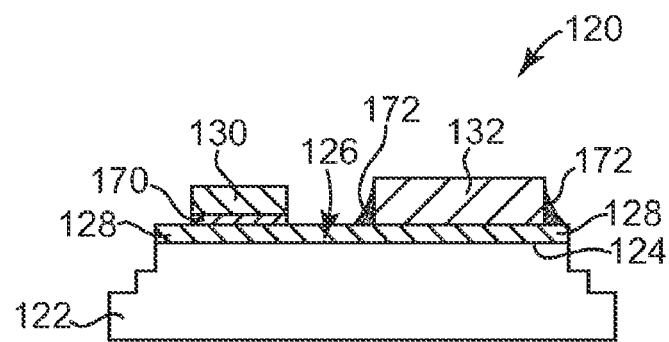
FIG. 10 is a side view of a leadframe including a diffusion barrier according to another embodiment.

FIG. 10 is a side view of another semiconductor device 120 according to one embodiment. Semiconductor device 120 includes a leadframe 122 having a first face 124 that defines a die pad 126 (or a die paddle 126), a diffusion barrier 128 deposited on die pad 126, a first chip 130 coupled to diffusion barrier 128, and a second chip 132 coupled to diffusion barrier 128.

In one embodiment, leadframe 122 is similar to leadframe 22, first chip 130 is similar to first chip 30, and second chip 132 is similar to second chip 32 as described above in FIG. 1 and 2. In one embodiment, diffusion barrier 128 includes tantalum (Ta), tantalum nitride (TaN), titanium (Ti), titanium tungsten (TiW), or other suitable barriers to the diffusion of metal ions into adhesion materials and is similar to diffusion barrier 28 described above, but is deposited over an entirety of die pad 126. In one embodiment, diffusion barrier 128 is deposited over die pad 126 between leadframe 122 and chips 130, 132. In another embodiment, diffusion barrier 128 is deposited over an entirety of first face 124 of leadframe 122. Diffusion barrier 128 provides a layer that limits diffusion of metal ions from leadframe 122 to chips 130, 132.

In one embodiment, first chip 130 is coupled to diffusion barrier 128 by an electrically isolating adhesion material 170, and second chip 132 is electrically coupled to diffusion barrier 128 by a conductive solder 172. Diffusion barrier 128 provides a layer that minimizes or eliminates diffusion or movement of metal ions from leadframe 122 into adhesion material 170, thus maintaining the integrity of the electrical connection and electronic function of first chip 130.

Diffusion barriers have been described that are deposited onto a leadframe and provide improved adhesion between the leadframe and components coupled to the diffusion barrier of the leadframe. The diffusion barrier is deposited directly onto the leadframe and minimizes or eliminates migration of metal ions from the leadframe to components coupled to the diffusion barrier/leadframe, such as chips.

The diffusion barrier prevents delamination of the leadframe, and prevents the metal of the leadframe from being exposed to oxygen, thereby minimizing undesirable oxidation of copper leadframe. To this end, the diffusion barriers described above provide improved electrical properties by minimizing oxidation of copper portions of the leadframe, and further contribute to improved adhesion of components to the leadframe. In general, the diffusion barrier is deposited as a thin film or thin layer that does not necessitate design alterations or design changes to the leadframe, chips or semiconductor die, or other components or materials coupled to the leadframe.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific leadframes discussed herein. Therefore, it is intended that this invention be limited only by the claims and the equivalents thereof.

What is claimed is:

1. A semiconductor device comprising:
   a leadframe comprising a first face and an opposing second face, a portion of the first face defining a die pad;
   wherein the die pad defines a first portion and a second portion;
   a diffusion baffler deposited on at least the first portion of the die pad;
   at least one chip coupled to the diffusion baffler by an electrically isolating adhesion material, and where the at least one chip comprises a logic chip.

2. The semiconductor device of claim 1, further comprising:
   encapsulation material deposited over the at least one chip and the die pad;
   wherein the leadframe, the chip, and the encapsulation material combine to define a semiconductor package.

3. The semiconductor device of claim 1, further comprising:
   a power chip in electrical communication with the second portion of the die pad such that the logic chip and the power chip are maintained at different voltage potentials.

4. The semiconductor device of claim 1, wherein the diffusion barrier is deposited on an entirety of the first face of the leadframe.

5. A semiconductor assembly comprising:
   a printed circuit board; and
   a semiconductor package coupled to the circuit board, the semiconductor package including:
   a leadframe comprising a first face and an opposing second face, a portion of the first face including a die pad that defines a first portion and a second portion, the second face attached to the printed circuit board,
   a diffusion baffler deposited on at least one of the first and second portions of the die pad,
   at least one chip coupled to the diffusion baffler by an electrically isolating adhesion material,
   wherein the diffusion barrier is deposited on the first portion of the die pad, and the at least one chip coupled to the diffusion barrier comprises a first chip coupled to the diffusion barrier by the electronically isolating adhesion material and a second chip electrically soldered to the second portion of the die pad, and
   encapsulating material deposited over the at least one chip and the first face of the leadframe.

6. A semiconductor assembly comprising:
   a printed circuit board; and
   a semiconductor package coupled to the circuit board, the semiconductor package including:
   a leadframe comprising a first face and an opposing second face, a portion of the first face including a die pad that defines a first portion and a second portion, the second face attached to the printed circuit board,
   a diffusion baffler deposited on at least one of the first and second portions of the die pad,
   at least one chip coupled to the diffusion barrier by an electronically isolating adhesion material,
   wherein the diffusion barrier is deposited on the first and second portions of the die pad, and the at least one chip coupled to the diffusion barrier comprises a first chip coupled to the diffusion barrier by the electrically isolating adhesion material and a second chip electrically soldered to the diffusion barrier, and
   encapsulating material deposited over the at least one chip and the first face of the leadframe.

7. A semiconductor assembly comprising:
   a printed circuit board; and
   a semiconductor package coupled to the circuit board, the semiconductor package including:
   a leadframe comprising a first face and an opposing second face, a portion of the first face including a die pad that defines a first portion and a second portion, the second face attached to the printed circuit board,
   a diffusion barrier deposited on at least one of the first and second portions of the die pad,
   at least one chip coupled to the diffusion barrier, and
   encapsulating material deposited over the at least one chip and the first face of the leadframe,
   wherein the package comprises a chip-by-chip package, the first chip comprising a logic chip and the second chip comprising a power chip.

8. A semiconductor assembly comprising:
   a printed circuit board; and
   a semiconductor package coupled to the circuit board, the semiconductor package including:
   a leadframe comprising a first face and an opposing second face, a portion of the first face including a die pad that defines a first portion and a second portion, the second face attached to the printed circuit board,
   a diffusion barrier deposited on at least one of the first and second portions of the die pad,
   at least one chip coupled to the diffusion barrier, and
   encapsulating material deposited over the at least one chip and the first face of the leadframe,
   wherein the diffusion barrier comprises one of Ta, TaN, Ti, and TiW deposited onto the die pad at a thickness of between about 0.1 to 10 micrometers.

9. A semiconductor device comprising:
   a metal leadframe comprising a first face and an opposing second face, a portion of the first face including a die pad;
   at least one chip comprising a chip backside coupled to the die pad, and the at least one chip comprises a logic chip; and
   means for forming a barrier to diffusion of metal ions from the die pad to the chip backside,
   wherein the at least one chip is coupled to the die pad by an electrically isolating adhesion layer, and
   wherein the means for forming a barrier to diffusion of metal ions from the die pad to the chip backside comprises means for forming a baffler to diffusion of metal ions from the die pad through the electrically isolating adhesion layer.

10. The semiconductor device of claim 9, wherein the metal leadframe comprises at least one of copper, silver, and gold and the means for forming a barrier to diffusion of metal ions comprises a metal deposited on at least a portion of the die pad.

11. The semiconductor device of claim 10, wherein the means for forming a barrier to diffusion of metal ions comprises a metal deposited on an entirety of the die pad.

12. A method of minimizing diffusion of metal ions between a metal support and a chip attached to the metal support in a semiconductor device, the method comprising:
providing a semiconductor package including a metal leadframe having a die attach pad, the die attach pad comprising a first portion and a separate second portion;
depositing a diffusion baffler only on the first portion of the die attach pad; and
attaching a backside of the chip to the diffusion barrier deposited on the die attach pad.

13. The method of claim 12, wherein attaching a backside of the chip comprises applying an electrically insulating adhesion layer between the backside of the chip and the diffusion baffler deposited on the first portion of the die attach pad.

14. The method of claim 13, further comprising:
coupling a second chip in electrical communication with the separate second portion of the die attach pad.

15. A method of minimizing diffusion of metal ions between a metal support and a chip attached to the metal support in a semiconductor device, the method comprising:
providing a semiconductor package including a metal leadframe having a die attach pad, the die attach pad comprising a first portion and a separate second portion;
depositing a diffusion barrier on the first portion and the separate second portion of the die attach pad; and
attaching a backside of the chip to the diffusion barrier deposited on the die attach pad,
wherein attaching a backside of the chip to the diffusion barrier deposited on the die attach pad comprises attaching a backside of a first electrically isolated chip to the diffusion barrier deposited on the die attach pad and attaching a backside of a second chip that is electrically coupled to the diffusion barrier deposited on the die attach pad.

16. A method of maintaining a voltage potential between two chips attached to a metal support in a chip-to-chip semiconductor package, the method comprising:
providing a semiconductor package including a metal leadframe having a die attach pad;
depositing a diffusion baffler on at least a portion of the die attach pad;
attaching a backside of a first chip to the diffusion barrier with a layer of electrically isolating adhesion material; and
attaching a backside of a second chip to the die attach pad;
wherein the diffusion barrier is configured to minimize a diffusion of metal ions between the metal leadframe and the backside of the first chip.

17. The method of claim 16, wherein the die attach pad comprises a first portion and a separate second portion, and depositing a diffusion barrier on at least a portion of the die attach pad comprises depositing a diffusion barrier on only the first portion of the die attach pad, and attaching a backside of a second chip to the die attach pad comprises attaching a backside of a power chip to the separate second portion of the die attach pad.

18. The method of claim 16, wherein the diffusion barrier is deposited on an entirety of the die attach pad and attaching a backside of a second chip to the die attach pad comprises attaching a backside of a second chip to the diffusion barrier deposited on the die attach pad.

19. The method of claim 16, wherein the leadframe comprises a copper leadframe, depositing a diffusion barrier on at least a portion of the die attach pad comprises sputter depositing a layer of TiN over only a first portion of the copper die attach pad, attaching a backside of a first chip to the diffusion baffler with a layer of electrically isolating adhesion material comprises attaching a backside of a logic chip to the layer of TiN with an electrically isolating paste, and attaching a backside of a second chip to the die attach pad comprises soldering a backside of a power chip to a copper second portion of the die attach pad.

20. A semiconductor device comprising:
a leadframe comprising a first face and an opposing second face, a portion of the first face defining a die pad;
a diffusion baffler deposited on at least a portion of the die pad, wherein the diffusion barrier comprises one of Ta, TaN, Ti, and TiW; and
at least one chip coupled to the diffusion barrier by an electronically isolating adhesion material.

21. The method of claim 15, wherein the first chip comprises a logic chip and the second chip comprises a power chip.

* * * * *